(12) United States Patent
Wong

(10) Patent No.: US 6,535,034 B1
(45) Date of Patent: Mar. 18, 2003

(54) HIGH PERFORMANCE INTEGRATED CIRCUIT DEVICES ADAPTABLE TO USE LOWER SUPPLY VOLTAGES WITH SMALLER DEVICE GEOMETRIES

(75) Inventor: Ting-wah Wong, Cupertino, CA (US)

(73) Assignee: Programmable Silicon Solutions, San Jose, CA (US)

( * ) Notice: Subject to any disclaimer, the term of this patent is extended or adjusted under 35 U.S.C. 154(b) by 0 days.

(21) Appl. No.: 08/903,549

(22) Filed: Jul. 30, 1997

(51) Int. Cl.⁷ ................................................ H03K 3/00
(52) U.S. Cl. ........................ 327/108; 327/112; 327/437
(58) Field of Search ........................ 327/108–112, 427, 327/434, 436, 437, 530

(56) References Cited

U.S. PATENT DOCUMENTS

| | | | |
|---|---|---|---|
| 3,764,396 A | | 10/1973 | Tarui et al. ................... 438/377 |
| 4,628,307 A | * | 12/1986 | Crouse ................... 340/825.05 |
| 4,943,943 A | | 7/1990 | Hayashi et al. .............. 365/185 |
| 4,954,730 A | * | 9/1990 | Yoh ........................... 307/451 |
| 5,018,104 A | | 5/1991 | Urai ........................... 365/200 |
| 5,251,169 A | | 10/1993 | Josephson .................... 365/72 |
| 5,420,817 A | * | 5/1995 | Kitagawa et al. ........... 365/226 |
| 5,457,653 A | | 10/1995 | Lipp ...................... 365/185.18 |
| 5,541,529 A | | 7/1996 | Mashiko et al. .............. 326/39 |
| 5,818,087 A | * | 10/1998 | Yee ............................. 257/355 |
| 5,818,758 A | * | 10/1998 | Wojciechowski ...... 365/185.18 |
| 5,835,414 A | * | 11/1998 | Hung et al. ............ 365/185.25 |

OTHER PUBLICATIONS

Streetman, Solid State Electronic Devices, Prentice Hall, 1980.*
Peng, J.Z., et al., Impact of Tunnel Oxide Quality on Vt Disturb and Sort Yield of High Density Flash Memory FPGA Devices, Abstract for 1997 NVSMW (1997), p. 1–2.

* cited by examiner

Primary Examiner—Kenneth B. Wells
(74) Attorney, Agent, or Firm—Trop, Pruner & Hu, P.C.

(57) ABSTRACT

A high performance integrated circuit device enables scaled low voltage transistors to be utilized as transfer gates with improved speed characteristics. At least some of the transistors are formed with thicker gate oxides and boosted positive and negative drive voltages are used with the thicker gate oxide transistors. The transfer gates may be driven by an inverter using a transistor formed in a triple well.

28 Claims, 3 Drawing Sheets

HIGH PERFORMANCE INTEGRATED CIRCUIT DEVICES ADAPTABLE TO USE LOWER SUPPLY VOLTAGES WITH SMALLER DEVICE GEOMETRIES

FIELD OF THE INVENTION

This invention relates generally to integrated circuits and particularly to advanced integrated circuits which use lower supply voltages and smaller device geometries.

BACKGROUND OF THE INVENTION

As integrated circuits scale to smaller and smaller geometries and supply voltages continue to decrease, a number of technologies which rely on voltage differences have become increasingly more difficult to implement in an effective fashion. The use of smaller voltages means that the speed at which devices operate may be diminished.

For example, pass transistors, sometimes also called transfer gates, interconnect basic building blocks of various components of integrated circuits. They can be used to connect a variety of different functional units, such as logic circuits. Pass transistors may be used, for example, in the following types of circuits: 1) microprocessors; 2) memories; 3) programmable logic; and 4) FPGAs. Among the myriad of applications for transfer gates are implementing a capacitive load adjustment capability such as that necessary with crystal oscillator circuits for frequency adjustment, implementing resistance adjustments such as those necessary for DC to DC converters, implementing programmable logic devices and implementing RF switching.

The ideal transfer gate can switch between the "on" and "off" states without excessive power consumption. It primarily operates in the linear region to achieve low resistance. In addition, the parasitic capacitance associated with the transfer gate should be lower than that of the input or output capacitance of the circuits which it connects.

As integrated circuits have scaled to smaller and smaller geometries, designers have been effective in reducing the power supply voltages which such devices utilize. While it is very advantageous to decrease the necessary power supply voltage, a number of problems arise with respect to the "on" resistance when the supply voltage decreases. See L. A. Glasser and D. W. Dobberpuhl, *The Design and Analysis of VLSI Circuits*, (December 1985) published by Addison-Wesley Publishing Co. at page 108. The transistor linear region resistance is inversely proportional to the gate to source voltage or "$V_{GS}$" less the threshold voltage or "$V_T$".

As the supply voltage is scaled to ever lower voltages, this voltage difference can be reduced significantly. In addition, the transistor saturation voltage scales as ($V_{GS}-V_T$) decreases. As the device geometry scales, transistors may also run into what is known as "velocity saturation". Thus, the voltage range where the transistor operates in the linear region becomes increasingly narrow as geometries and supply voltages are scaled.

Conventionally, to reduce the "on" resistance of a transfer gate, a designer may consider one of a couple of known approaches. The designer may increase the transistor width to thereby decrease the "on" resistance. There is a linear relationship between increasing transistor width and decreasing "on" resistance. However, the source/drain parasitic capacitance also increases linearly with increasing transistor width. Thus, the reduction of "on" resistance in this fashion may result in an increase in parasitic capacitance which may be unacceptable. Particularly, since the resistance times the capacitance or "RC product" typically stays constant for a given technology, the increased width of the transfer gate does not significantly improve the performance of the transistor.

Another approach is to increase the transfer gate drive by using a floating gate transistor. See U.S. Pat. No. 5,457,653. However, the usefulness of this approach is limited by the data of retention requirement. That is, the floating gate voltage cannot exceed 4 to 5 megavolts per centimeter because the floating gate must retain its data for ten years and also for disturb concerns. This approach, therefore, implemented as an EEPROM, pays for increased gate drive with an increased potential for reliability problems and particularly the possibility of gate oxide breakdown and read disturb.

Because the transistor linear region resistance scales inversely with gate voltage less the threshold voltage, and the saturation voltage scales with gate voltage less the threshold voltage, if the gate voltage is equal to the supply voltage, the linear region "on" resistance increases and the voltage range where the transistor operates in the linear region narrows. Surprisingly, this problem becomes more severe with the latest, scaled technologies. That is, as devices scale in terms of geometry and supply voltages, the problem is exacerbated for pass transistors. This means that, contrary to the well established industry conventional wisdom, at a certain point, continuing to scale devices and supply voltages may be counterproductive to improved pass transistor operating speed. Reducing supply voltage and scaling geometries, which have previously resulted in lower power consumption, could actually result in slower logic and pass transistors as supply voltages drop below 3 volts.

Thus, a solution to this trade off, which is more desirable than any currently envisioned, is needed to enable the continued increase in transfer gate speed with scaled technologies.

SUMMARY OF THE INVENTION

In accordance with one embodiment of the present invention, an integrated circuit device is formed on a semiconductor die adapted to operate with positive and negative supply voltages. The device includes a first group of integrated MOS transistors formed on the die. The first group of transistors have gate oxides. A second group of integrated MOS transistors are formed on the die which also have gate oxides. The gate oxides of the second group of transistors are thicker than the gate oxides of the first group of transistors. A path is provided to communicate boosted positive and negative supply voltages, greater than the positive and negative supply voltages, to at least some of the second group of transistors.

In accordance with another aspect, an integrated circuit device includes a first transistor having a gate electrode and a gate oxide. A second transistor has a gate electrode and a gate oxide. The gate oxide of the second transistor is thicker than the gate oxide of the first transistor. The second transistor gate electrode is selectively connectable to a positive or a negative bias voltage.

In accordance with yet another aspect, an integrated circuit device includes a first transistor having a gate electrode and a gate oxide. A second transistor has a gate electrode and a gate oxide, the gate oxide of the second transistor being thicker than the gate oxide of the first transistor. A source of a first and second positive potential is provided, the second positive potential being higher than the first positive potential. A source of negative potential is also provided. The gate electrode of the second transistor is selectively connectable to the higher positive potential or the negative potential. The source and drain of the second transistor is connected as a transfer gate to a pair of logic circuits so as to permit selective communication between the logic circuits through the second transistor.

In accordance with still another aspect, a transfer gate is implemented by a zero threshold transistor having a gate electrode. That gate electrode is selectively connectable to a negative potential.

DESCRIPTION OF THE PREFERRED EMBODIMENTS

Figure 1:
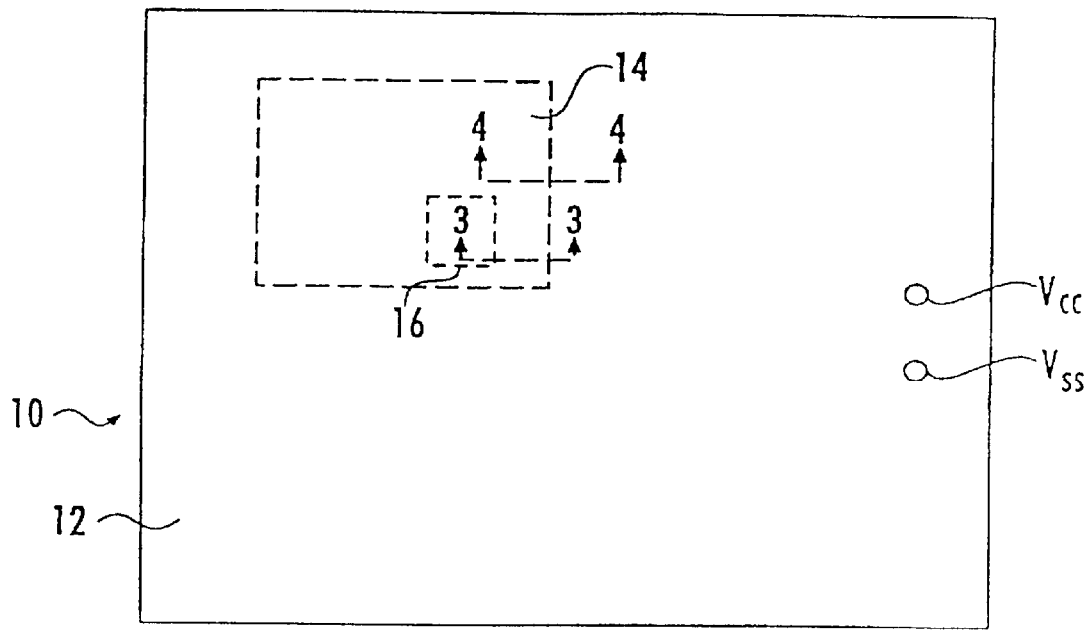
FIG. 1 is a greatly enlarged top plan view of a die in accordance with one embodiment of the present invention.

Referring to FIG. 1, an integrated circuit device is implemented on a semiconductor die 10 which is formed by cutting the die from a conventional semiconductor wafer (not shown). Formed on the die 10 are a large number of MOS transistors connected to implement the desired device functionality.

The majority of the topology of the die 10 may be taken up by the area 12, populated by conventional logic circuitry. The area 14 of the die 10 has MOS transistors (not shown) having gate oxides which are thicker than the gate oxides of the transistors formed in the area 12. A subset of the area 14, labelled 16 in FIG. 1, includes devices having a thicker gate oxide that are formed in an embedded P-well (not shown). In this way, transistors with at least two different gate oxide thicknesses are provided and certain devices may be formed in an embedded P-well (or triple well) to enable them to operate more efficiently with negative source bias.

While the die 10 has been explained in terms of an example where transistors are segregated based on gate oxide thicknesses and use the embedded wells, it will be appreciated that the different device types can be physically distributed among one another as well. Similarly, the relative sizes of the areas 12, 14, and 16 can be varied in accordance with specific needs.

Figure 2:
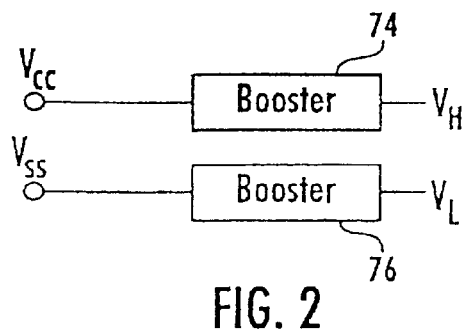
FIG. 2 is a schematic view of the die power supplies.

As shown in FIG. 2, the die 10 may receive two external supply voltages Vcc and Vss. The supply voltage Vcc may be 5 volts or less and the voltage Vss may be 0 volts. The supply voltages Vcc and Vss are boosted by boosters 74 and 76, respectively, to form the boosted voltages $V_H$ and $V_L$. The boosted voltages $V_H$ and $V_L$ may be several times more positive than Vcc and more negative than Vss voltages. For example, $V_H$ could be in the range of 4 to 12 volts while $V_L$ could be in the range of –2 to –5 volts. Alternatively, the die 10 may receive all of Vcc, Vss, $V_H$ and $V_L$ from external voltage supplies.

Figure 3:
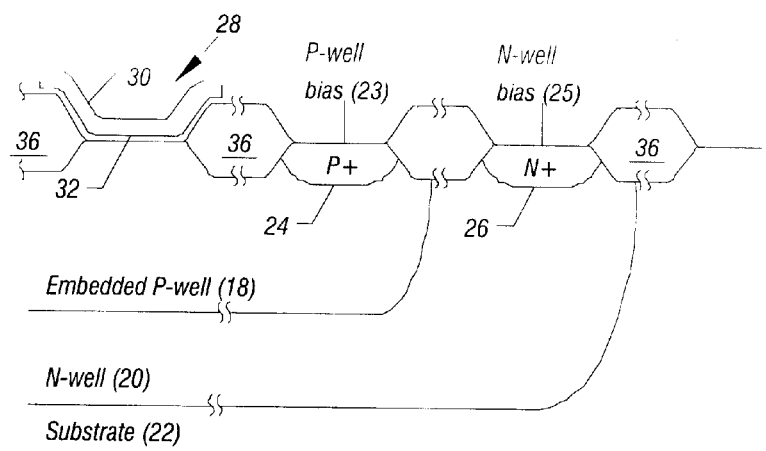
FIG. 3 is a partial, enlarged cross-sectional view taken generally along the line 3—3 in FIG. 1.

The configuration of the transistors in the area 16 is illustrated in FIG. 3. A device 28 is formed in an embedded P-well 18. The embedded P-well 18 is formed in an N-well 20 which is, in turn, defined within a P-type semiconductor substrate 22. P-well bias 23 can be applied through a P+ region 24, and N-well bias 25 may be applied through an N+ region 26. The transistor 28 includes a gate electrode 30 and a gate oxide 32 with an active region defined by field oxide areas 36.

Figure 4:
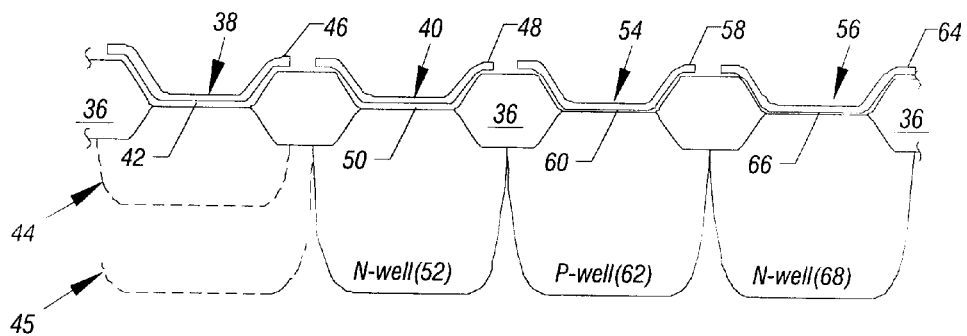
FIG. 4 is a partial, enlarged cross-sectional view taken generally along the line 4—4 in FIG. 1.

The region 14 may include CMOS N- and P-channel transistors 38 and 40, as shown in FIG. 4. The thick gate oxide N-channel transistor 38 may include a thick gate oxide 42 and a gate electrode 46. Similarly, the thick gate oxide P-channel transistor 40 includes a gate electrode 48 formed over a thick gate oxide 50, in turn defined over an N-well 52.

The transistor 38 may be formed without a p-well or with a light p-well 44 or a light p-well 44 embedded in n-well 45 SO that it is a zero threshold transistor. By "zero threshold" it is intended to refer to transistors with relatively light p-wells, for example, less than $1\times10^{16}$ atoms per square centimeter, or no p-well at all. Thus, the zero threshold transistor may have a small threshold voltage of from about 0.1 to –0.3 volts.

Finally, the region 12 is populated by N- and P-channel transistors, such as the transistors 54 and 56, shown in FIG. 4. The N-channel "regular" gate oxide transistor 54 includes a gate 58, a gate oxide 60, and a P-well 62. Likewise, the "regular" gate oxide P-channel transistor 56 includes a gate electrode 64, a gate oxide 66 and an N-well 68. The transistors 54 and 56 may be conventional in all respects. They are formed with gate oxides that are thinner than the gate oxides of the transistors 28, 38, and 40 formed in the area 14.

Figure 5:
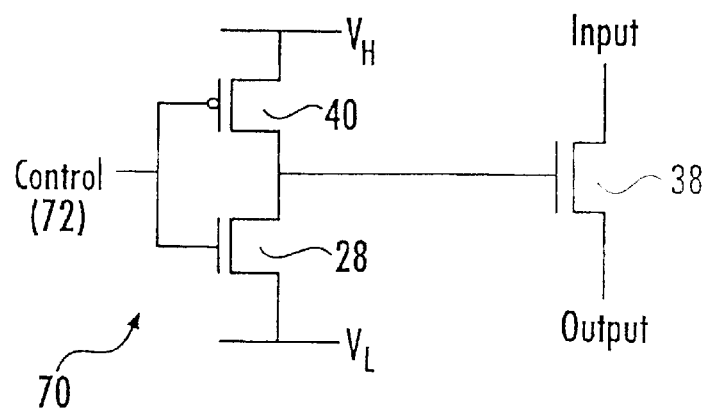
FIG. 5 is a circuit diagram of one illustrative NMOS transfer gate.

Referring now to FIG. 5, the thick gate oxide N-channel transistor 38 may implement a transfer gate driven by an inverter 70. The inverter 70 may include a thick gate oxide P-channel transistor 40 and an embedded thick gate oxide N-channel transistor 28. The control signal 72 may be a boosted positive ($V_H$) or negative ($V_L$) signal which causes the inverter 70 to supply either the boosted positive potential $V_H$ or the more negative potential $V_L$ as the drive bias for the gate of the transistor 38.

The boosted voltages $V_H$ or $V_L$ may be formed by boosting positive (Vcc) and negative (Vss) supply voltages supplied to the die 10, using conventional charge boosting circuitry 74, 76. These boosted gate drive voltages increase the difference ($V_{GS}-V_T$), thereby decreasing the "on" resistance and increasing the saturation voltage of the transfer gate implemented by the transistor 38.

If the control signal 72 is $V_H$, the inverter 70 supplies the voltage $V_L$ to the gate of the transistor 38. The transistor 38 is then "off". When the control signal 72 is $V_L$, the high positive voltage $V_H$ is applied to the gate of the transistor 38 and the transistor is "on". The transistor 38 can be turned off hard, because of the negative gate voltage.

Figure 6:
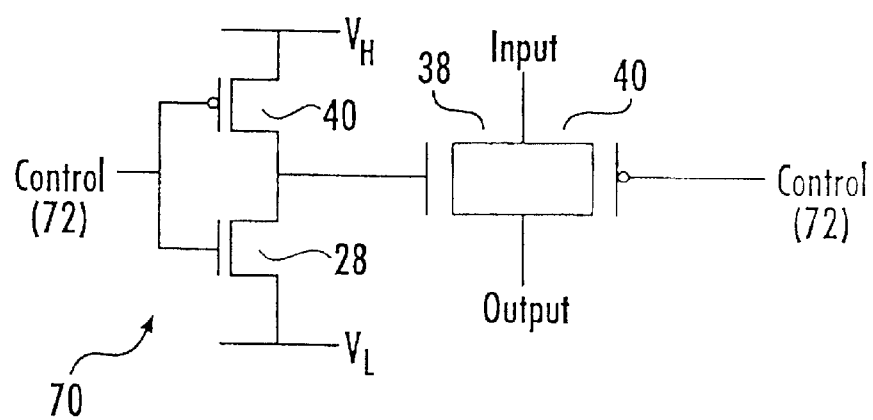
FIG. 6 is a circuit diagram of one illustrative CMOS transfer gate.

A CMOS implementation of the transfer gate, shown in FIG. 6, uses the same inverter 70 arrangement, but includes a parallel pair of N-channel 38 and P-channel 40, thick gate oxide transistors. The gate of the P-channel transistor 40 is driven by the control signal 72.

While FIGS. 5 and 6 illustrate an inverter 70 controlling the potential on the gate of a pass transistor, it should be understood that a variety of other circuits can be used for this purpose.

The transfer gate "on" resistance for the linear region can typically be reduced by a factor of 2 to 4 depending on the gate bias. At the same time, the thicker gate oxide of the transfer gate allows more gate voltage to be applied to the transistor without creating reliability problems.

Thus, the term $V_{GS}-V_T$ may be increased without causing gate oxide reliability problems. Typically, in 0.6 micron or less technologies, using 3 volts or less, the gate oxides 32, 42, and 50 may be 120 Angstroms or greater while the gate oxides 60 and 66 may be less than 100 Angstroms.

By providing an embedded P-well transistor 28, the N-well 20 may be tied to Vss or Vcc. This allows the P-well to be pumped negatively. This in turn allows the source of the transistor, situated in the P-well, to go negative. Therefore, a negative voltage may be applied to the source of the transistor 28 in the configuration shown in FIG. 5. This enables the transistors 28 and 38 to shut off hard.

The negative gate drive also reduces the gate-to-N junction overlap capacitance and the junction capacitance. Because of the negative gate voltage, the channel and well doping concentrations can be reduced. Hence, one transistor 38 is situated in a "light" p-well 44. Typically, the p-well doping concentration may be reduced or eliminated. For example, well doping may be reduced from a typical concentration of $1\times10^{17}$ to $1\times10^{16}$ atoms per square centimeter or less. This may achieve a substantial reduction in the junction capacitance of the transistor. The negative voltage also reduces the N-depletion capacitance in the N-region under the gate oxide typically by a factor of 2 to 3. Furthermore, by embedding the transfer gate in a p-well, when the n-well is tied to Vss or Vcc, negative voltage can be applied to the p-well and the junction depletion region increases. This reduces the junction capacitance even further, for example, by a factor of 1.5.

The charge pump for creating the high and low voltages $V_H$ and $V_L$ can be implemented using standard charge pump designs. The reference "On Chip High Voltage Generation and MOS Integrated Circuits Using an Improved Voltage Multiplier Technique", *IEEE Journal of Solid State Circuits*, Vol. SC-11, No. 3, June 1976, discloses one useful design for creating the high voltage charge pump and is hereby expressly incorporated herein. Similarly, the provision of both a positive or negative boosted voltage can be accomplished as taught in L. A. Glasser and D. W. Dobberpuhl, *The Design and Analysis of VLSI Circuits* (December 1985) published by Addison-Wesley Publishing Co., pages 301–329, which is hereby expressly incorporated by reference herein.

Ideally, the boosted voltage $V_H$ is set to the highest possible voltage before any long term gate oxide reliability problems occur. This reduces the "on" state resistance of the pass or transfer gate. The voltage $V_L$ is set at a low voltage such that the N-junction capacitance can be reduced. Typically $V_L$ is −1.5 to −2.0 v.

The thickness of the thick gate oxides for the transistors 28, 38 and 40 can be determined by first determining the maximum voltage level that needs to be transferred by the transfer gate 38. Normally this transfer voltage is equal to Vcc. The transistor saturation voltage, "$V_{DSAT}$", is set such that $V_{DSAT}$ is greater than or approximately equal to the transfer voltage. Thus, the transistor always operates in the linear region. Using the following equation, the term "$V_{GS}-V_T$" can be determined:

$$V_{DSAT} = A + B - \sqrt{A^2 + B^2}$$

Where: $A=(V_{GS}-V_T)/(1+\delta)$;
$B=V_{MAX}L/\mu$
$V_T$=the transistor threshold voltage;
L=channel length $\mu$=mobility; and
$V_{max}$=maximum carrier velocity ($\sim 10^7$ cm./s).

$$\delta = \frac{\gamma}{2\sqrt{V_sB + 2\phi_{FP}}}$$

$$\gamma \equiv \frac{\sqrt{2\varepsilon_{si}qNa}}{Cox}$$

Where: VsB=source to bulk potential
$\Phi_{FP}$=potential at inversion surface
$\in_{si}$=silicon dielectric constant
Na=bulk doping concentration
Cox=oxide thickness
q=electron charge The oxide thickness Cox is generally greater than or approximately equal to ($V_{GS}-V_T$) divided by the electric field (E) or about 4 to about 5 megavolts per centimeter. Thus, for a 3-volt transfer voltage, $V_{GS}-V_T$ is approximately 6 to 8 volts and Cox would be about 150 to 200 Angstroms with a channel length of from about 0.6 to 0.8 microns.

A few examples may help to appreciate the impact of the present invention. Using a thicker gate oxide thickness of 150 Angstroms and a channel length of 0.6 microns, the quantity $V_{GS}-V_T$ is approximately 6 volts. The transistor current at a $V_{DSAT}$ of 3 volts results in a drain current of about 750 microamps per micron at 3 volts. The drain current is about 633 microamps per micron at 2 volts.

This can be contrasted with a conventional technology which would have a gate oxide thickness of about 100 Angstroms, a gate length of about half a micron using 3-volt technology. The transistor current at a $V_{DSAT}$ equal to 3 volts is approximately 330 microamps per micron. It is evident that the thick gate oxide enables a significantly greater drive current.

Similarly, with a 2-volt technology using a gate oxide thickness of 70 Angstroms and a gate length of 0.35 microns, the drain current would be approximately 250 microamps per micron. Thus, it is evident that decreasing gate lengths and decreasing gate voltages have a dramatically adverse effect on drain current. This necessarily has a severe impact on speed.

Thus, it can be seen that at supply voltages of 3 volts and less, device scaling can result in slower devices. The present invention allows for significantly increased transistor speeds at significantly scaled geometries and with significantly scaled supply voltages.

The illustrative parameters set forth herein contemplate a 0.35 μm or higher feature size with Vcc potentials of 2.7 volts or higher. As the technology permits lowering voltages and smaller feature sizes, the parameters herein would scale accordingly.

The starting substrate material is typically P-type (100) silicon, for example having a resistivity range of 10–25 ohm-cm. The P-well 18 is embedded in an N-well 20 in the so-called triple well process. The P-well 18 has a typical well depth of, for example, 2 to 4 μm with an average doping concentration, for example, in the range of $5\times10^{15}$ to $5\times10^{16}$ atoms per cubic centimeter.

The N-well has a typical well depth of, for example, 4–8 μm. The doping concentration may be from $4\times10^{15}$ to $1\times10^{16}$ atoms per cubic centimeter. The triple well is formed by the P-well 18 counterdoping the N-well 20.

The formation of the elements in the triple well is as follows. An N-well implant is done, for example, with phosphorous ($P_{31}$) with a typical dose of 1.0 to $1.5\times10^{13}$ atoms per square centimeter and energies from 160 Kev to about 100 Kev. The N-well implant is driven using a high temperature step which may typically be 6 to 12 hours at 1125 to 1150° C. The N-well 20 is then counterdoped with a P-well implant. Typical dosages for the P-well implant could be 1.5 to 2.5×10$^{13}$ atoms per square centimeter with energies of 30 Kev to 180 Kev using a species such as boron (B11).

The N-well 20 and P-well 18 are then driven, typically 6 to 10 hours at 1125 to 1150° C. This sets the wells to the desired doping concentrations and depths.

After well formation, standard logic field oxide formation and channel stop formation steps are applied. The field oxide 36 and implant doses are adjusted to achieve a field threshold of 7 to 14 volts, which is determined by the V$_H$ level of the booster pump 74.

After removal of sacrificial oxide, the thick gate oxides 42, 50 and the thin gate oxides 60, 66 are formed. For example, a 100 Angstrom oxide may be grown across the wafer followed by threshold adjustment implants. Afterward, resist is applied. The resist may cover everything except the thin oxide areas 60 and 66. A buffered oxide etch (BOE) is used to etch off the oxide in the region that is not covered by resist. After resist removal, an oxide is grown to a thickness, for example 100 Angstroms, to form the thin oxides 60 and 66. The rest of the wafer uses gate oxides 42 and 50 with a typical thickness of 160 Angstroms. Standard gate deposition, patterning and back end processing follows the standard logic process. The forms transistors with two gate oxide thicknesses.

While the present invention has been described with respect to a single preferred embodiment, those skilled in the art will appreciate a number of modifications and variations, and it is intended that the appended claims cover all such modifications and variations which fall within the true spirit and scope of the present invention.

What is claimed is:

1. An integrated circuit device formed on a semiconductor die adapted to operate with positive and negative supply voltages, said device comprising:
   a first group of integrated MOS transistors formed on said die, said first group of transistors having gate oxides;
   a second group of integrated MOS transistors formed on said die, said second group of transistors having gate oxides, said gate oxides of said second group of transistors being thicker than said gate oxides of said first group of transistors; and
   a path system or communicating boosted positive and negative supply voltages, greater than said positive and negative supply voltages, to a plurality of said second group of transistors.

2. The device of claim 1 wherein said second group of integrated MOS transistors have sources and drains of a first conductivity type, said device further including a first well formed in said die, said first well being of a second conductivity type, a plurality of said sources and drains of said second group of integrated MOS transistors being formed in said first well, a second well formed in said die, said first well being located in said second well, said second well being of said first conductivity type.

3. The device of claim 1 wherein a plurality of said second group of integrated MOS transistors form transfer gates having parallel connected N-channel and P-channel transistors having their gates adapted to connect to said boosted positive and negative voltages.

4. The device of claim 1 wherein said second group of integrated MOS transistors form a plurality of transfer gates comprising N-channel transistors whose gates are connected to be driven by said boosted positive and negative voltages.

5. The device of claim 1 wherein the oxide thicknesses of said first and second group of integrated MOS transistors are equal to or greater than the gate to source voltage minus the threshold voltage divided by 5 megavolts per centimeter.

6. The device of claim 1 wherein said gate oxides of said first group of transistors are about 100 Angstroms or less and said gate oxides of said second group of transistors are about 120 Angstroms or greater.

7. The device of claim 1 including a triple well formed in said die, wherein at least one of said second group of MOS transistors is formed in said triple well.

8. The device of claim 7 including an inverter driving the gate of one of said transistors of said second group, said inverter including said transistor formed in said triple well.

9. The device of claim 8 wherein the input to said inverter is one of said boosted voltages and said output of said inverter, connected to said transistor formed in said triple well, is the other of said boosted voltages, said transistor acting as a transfer gate.

10. The device of claim 3 wherein at least two of said second group of integrated MOS transistors forming transfer gates are formed in an embedded P-well.

11. An integrated circuit device comprising:
    a first transistor having a gate electrode and a gate oxide;
    a second transistor having gate electrode and a gate oxide, said gate oxide of said second transistor being thicker than said gate oxide of said first transistor, said second transistor gate electrode adapted to be selectively connected to a positive or a negative bias voltage; and
    said device receiving an external supply voltage, said gate electrode of said first transistor being connectable to said external supply voltage, the gate electrode of said second transistor adapted to be connected to a voltage greater than said supply voltage.

12. The device of claim 11 including a third transistor and a triple well, said third transistor formed in said triple well formed in said die.

13. The device of claim 12 including an inverter, said third transistor being used in said inverter.

14. The device of claim 11 wherein said second transistor is arranged to act as a transfer gate, whose gate voltage is adapted to be selectively connected to a boosted positive supply voltage to turn said transfer gate "on" or a negative voltage to turn said transfer gate "off".

15. The device of claim 14 including an inverter adapted to supply said boosted positive and said negative voltage to said transfer gate.

16. The device of claim 15 wherein said inverter is formed of at least two transistors having gate oxides thicker than said first transistor.

17. The device of claim 16 wherein one of said two transistors having gate oxides thicker than said first transistor is formed in a triple well.

18. The device of claim 17 wherein one of said two transistors having gate oxides thicker than said first transistor is a P-channel transistor and the other is an N-channel transistor.

19. The device of claim 18 wherein said N-channel transistor is formed in said triple well, said N-channel transistor having a source, said source adapted to be biased negatively.

20. An integrated circuit device comprising:
    a first transistor having a gate electrode and a gate oxide;
    a second transistor having a gate electrode, a source, a drain, and a gate oxide, said gate oxide of said second transistor being thicker than said gate oxide of said first transistor;

a source of a first and second positive potential, said second positive potential being higher than said first positive potential;

a source of negative potential;

the gate electrode of said second transistor adapted to be selectively connected to said higher positive potential or said negative potential; and a pair of logic circuits, said source and drain of said second transistor connected as a transfer gate to said logic circuits so as to permit selective communication between said logic circuits through said second transistor.

21. The device of claim 20 wherein said second positive potential and said negative potential are supplied to the gate electrode of said second transistor by an inverter, said inverter being formed from an N-channel and a P-channel transistor, said N-channel transistor being formed in a triple well, the source of said N-channel transistor being connected to said negative potential.

22. The device of claim 21 wherein said second transistor is an N-channel transistor, said device including a third transistor connected in parallel with said second transistor, said second and third transistors together forming said transfer gate.

23. The device of claim 22 wherein either said higher positive or said negative voltage may selectively be communicated to the gate electrode of said third transistor.

24. The device of claim 23 wherein said second transistor has a gate oxide of greater than 120 Angstroms and said first transistor has a gate oxide of less than 120 Angstroms.

25. The device of claim 20 wherein said second transistor is formed in an embedded p-well.

26. A transfer gate comprising a zero threshold transistor having a gate electrode, said gate electrode adapted to be selectively connected to a negative potential, said transfer gate coupled to a supply voltage, wherein said transfer gate is adapted to be selectively connected to a positive voltage boosted above said supply voltage.

27. The gate of claim 26 wherein said gate is formed in an embedded p-well.

28. The gate of claim 26 further including a p-channel transistor connected in parallel with said zero threshold transistor.

* * * * *

UNITED STATES PATENT AND TRADEMARK OFFICE
CERTIFICATE OF CORRECTION

PATENT NO.    : 6,535,034 B1
DATED         : March 18, 2003
INVENTOR(S)   : Ting-wah Wong It is certified that error appears in the above-identified patent and that said Letters Patent is hereby corrected as shown below:

Column 7,
Line 48, "a path system or" should be -- a path system for --.

Signed and Sealed this

Thirteenth Day of May, 2003

JAMES E. ROGAN
*Director of the United States Patent and Trademark Office*